US010986260B2

(12) United States Patent
Liu (10) Patent No.: US 10,986,260 B2
(45) Date of Patent: Apr. 20, 2021

(54) SELFIE STICK AND METHOD FOR CONTROLLING PHOTOGRAPHIC DEVICE BY SELFIE STICK (71) Applicant: SHENZHEN ROYOLE TECHNOLOGIES CO., LTD., Shenzhen (CN)

(72) Inventor: Wenjun Liu, Shenzhen (CN)

(73) Assignee: SHENZHEN ROYOLE TECHNOLOGIES CO., LTD., Shenzhen (CN)

( * ) Notice: Subject to any disclaimer, the term of this patent is extended or adjusted under 35 U.S.C. 154(b) by 0 days.

(21) Appl. No.: 16/347,695

(22) PCT Filed: Nov. 4, 2016

(86) PCT No.: PCT/CN2016/104714
§ 371 (c)(1),
(2) Date: May 6, 2019

(87) PCT Pub. No.: WO2018/082047
PCT Pub. Date: May 11, 2018

(65) Prior Publication Data
US 2019/0258142 A1 Aug. 22, 2019

(51) Int. Cl.
H04N 5/232 (2006.01)
F16M 11/28 (2006.01)
(Continued)

(52) U.S. Cl.
CPC ....... H04N 5/23203 (2013.01); F16M 11/041 (2013.01); F16M 11/06 (2013.01);
(Continued)

(58) Field of Classification Search
CPC .... G03B 17/56; G03B 17/561; G03B 17/563; H04N 5/232–23206; H04N 5/232933;
(Continued)

(56) References Cited

U.S. PATENT DOCUMENTS

2014/0327624 A1* 11/2014 Srinivas ................ G06F 3/0412
345/173
2015/0169011 A1* 6/2015 Bibl .................... H01L 31/0216
345/175
(Continued)

FOREIGN PATENT DOCUMENTS

CN 105137701 A 12/2015
CN 105472225 A 4/2016
(Continued)

OTHER PUBLICATIONS

International Search Report issued in corresponding International Application No. PCT/CN2016/104714, dated Jul. 20, 2017, pp. 1-4, Beijing, China.

Primary Examiner — Paul M Berardesca
(74) Attorney, Agent, or Firm — Hauptman Ham, LLP (57) ABSTRACT A selfie stick comprises: a fixing support assembly, configured for clamping a photographic device; a telescopic tube assembly, a first end of which connects to the fixing support assembly; and a handle assembly, connecting to a second end of the telescopic tube assembly, the second end of the telescopic tube assembly being distant from the first end. The handle assembly comprises a touch screen assembly wirelessly connecting to the photographic device, and the photographic device is controlled by touching the touch screen assembly. The selfie stick according to the present disclosure can adjust photographic parameters or functions of the photographic device. The present disclosure further discloses a method for controlling the photographic device by the selfie stick.

16 Claims, 10 Drawing Sheets (51) Int. Cl.
  *G03B 17/56* (2021.01)
  *F16M 13/04* (2006.01)
  *F16M 11/04* (2006.01)
  *F16M 11/06* (2006.01)
  *G06F 3/041* (2006.01)
  *H05K 1/18* (2006.01)

(52) U.S. Cl.
  CPC ............ *F16M 11/28* (2013.01); *F16M 13/04* (2013.01); *G03B 17/561* (2013.01); *G03B 17/563* (2013.01); *G06F 3/0412* (2013.01); *H04N 5/23216* (2013.01); *H05K 1/18* (2013.01); *G06F 2203/04102* (2013.01); *H05K 2201/10128* (2013.01)

(58) Field of Classification Search
  CPC ....... H04N 5/23216; F16M 11/20–425; F16M 13/04; G06F 3/041–04186; G06F 3/044–0448; G06F 1/1637–1654; H04M 1/04; A45B 1/00; A45B 3/00–04; H05K 2201/10128; H05K 2201/10136
  See application file for complete search history.

(56) References Cited

U.S. PATENT DOCUMENTS

2016/0252799 A1* 9/2016 Li ........................ F16M 13/04
                                                                    396/425
2017/0064176 A1* 3/2017 Kim ..................... G02B 27/644

FOREIGN PATENT DOCUMENTS

| CN | 105472254 A | 4/2016 |
| CN | 105650416 A | 6/2016 |
| CN | 205490870 A | 8/2016 |
| CN | 105933487 A | 9/2016 |
| CN | 105975830 A | 9/2016 |
| WO | 2015127329 A | 8/2015 |
| WO | 2016037409 A1 | 3/2016 |

* cited by examiner

SELFIE STICK AND METHOD FOR CONTROLLING PHOTOGRAPHIC DEVICE BY SELFIE STICK

RELATED APPLICATION

The present application is a National Phase of International Application Number PCT/CN2016/104714, filed Nov. 4, 2016.

TECHNICAL FIELD

The present disclosure relates to photography controlling technology, and in particular, to a selfie stick and a method for controlling a photographic device by the selfie stick.

BACKGROUND

Prior selfie sticks generally control mobile phones by means of physical buttons, and instruct the mobile phones to take photographs with front cameras or rear cameras thereof. However, when a telescopic component of a selfie stick is extended, a certain distance exists between a user's fingers and a mobile phone, and hence, it is difficult for the user to directly touch the mobile phone so as to adjust the focal length of the mobile phone. Consequently, when multiple persons are photographed or a selfie is taken from a long distance, it is hard to have a satisfactory photograph.

SUMMARY

An embodiment of the present disclosure to solve a technical problem is to provide a selfie stick capable of adjusting photographic parameters or functions of a photographic device.

Furthermore, a method for controlling the photographic device by the selfie stick is provided by an embodiment of the present disclosure.

In order to achieve the above-mentioned purposes, embodiments of the present disclosure adopt following technical solutions.

On the one hand, a selfie stick is provided by an embodiment of the present disclosure, and comprises:

a fixing support assembly, configured for clamping a photographic device;

a telescopic tube assembly, a first end of which connects the fixing support assembly; and a handle assembly, connecting to a second end of the telescopic tube assembly, the second end of the telescopic tube assembly being distant from the first end, wherein the handle assembly comprises a touch screen assembly wirelessly connecting to the photographic device, and the photographic device is controlled by touching the touch screen assembly.

On the other hand, a method for controlling a photographic device by a selfie stick is further provided by an embodiment of the present disclosure, and comprises:

touching a touch screen assembly of a handle assembly of the selfie stick;

sensing, by the touch screen assembly, a touch operation performed on the touch screen assembly to produce a touch signal;

producing, by a control chip of the handle assembly, a control signal according to the touch signal; and transmitting the control signal to the photographic device to control the photographic device.

Compared to the prior art, the selfie stick according to the present disclosure has the touch screen assembly. The touch screen assembly can connect to the photographic device. Since the touch screen assembly may identify different touch operations, a user may, by touching the touch screen assembly with different operations, adjust the various photographic parameters or functions of the photographic device, for example, a focal length, an aperture, a color, etc., thereby solving a problem that the parameters cannot be adjusted since a prior selfie stick only has a single button functioning as a shutter when photographs are taken. Consequently, the user can have better photographing experience.

BRIEF DESCRIPTION OF THE DRAWINGS

In order to more clearly describe technical solutions according to the present disclosure, accompanying drawings to be used in embodiments will be briefly introduced hereinafter. Apparently, the accompanying drawings described hereinafter show some embodiments of the present disclosure, and persons skilled in the art may also derive other drawings from these accompanying drawings without creative efforts.

DETAILED DESCRIPTION

A clear, complete description for technical solutions of embodiments of the present disclosure is provided below, in conjunction with the drawings in the embodiments of the present disclosure. Apparently, the embodiments to be described are a part, rather than all of embodiments of the present disclosure. Other embodiments obtained by persons skilled in the art from the embodiments given herein without creative efforts should all fall within the protection scope of the present disclosure.

Referring to FIG. 1 to FIG. 4, a selfie stick 100 is provided by an embodiment of the present disclosure. The selfie stick 100 includes a fixing support assembly 1, a telescopic tube assembly 2 and a handle assembly 3. The fixing support assembly 1 can clamp a photographic device 200. A first end 21 of the telescopic tube assembly 2 connects to the fixing support assembly 1. The handle assembly 3 connects to a second end 22 of the telescopic tube assembly 2. The second end 22 of the telescopic tube assembly 2 is distant from the first end 21 of the telescopic tube assembly 2. The handle assembly 3 includes a touch screen assembly 31. The touch screen assembly 31 can wirelessly connects to the photographic device 200, and the photographic device 200 is controlled by touching the touch screen assembly 31.

In the embodiment, the selfie stick 100 includes the touch screen assembly 31. The touch screen assembly 31 wirelessly connects to the photographic device 200. Since the touch screen assembly 31 may identify different touch operations, a user may, by touching the touch screen assembly 31 with different operations, adjust various photographic parameters or functions of the photographic device 200, for example, a focal length, an aperture, a color, etc., thereby solving a problem that the parameters cannot be adjusted since a prior selfie stick only has a single button functioning as a shutter when photographs are taken. Consequently, the user can achieve better photographing experience.

It should be understood that, the user may control the photographic device 200 achieving different functions by means of different touch operations on the touch screen assembly 31, for example, reducing the focal length by means of a upward slide operation or a zoom-out operation, increasing the focal length by means of a downward slide operation or a zoom-in operation, taking a photograph by means of a single-tap operation, taking consecutive photographs by means of a double-tap operation, etc.

The photographic device 200 may include various mobile terminals with the photographic function, for example, mobile phones.

Furthermore, referring to FIG. 1 to FIG. 6, as an optional embodiment, the touch screen assembly 31 includes a control board 311, a touch screen 312, a control chip 313 and a wireless connector 314. The control board 311 has a first surface and a second surface 3112 opposite to each other. The touch screen 312 is arranged on the first surface. The touch screen 312 includes a detecting surface facing away from the first surface. The control chip 313 is arranged on the second surface 3112. The control chip 313 electrically connects to the touch screen 312. A software program configured for supporting the control of various touch operations over the photographic device 200 is stored in the control chip 313. The wireless connector 314 is arranged on the second surface 3112. The wireless connector 314 electrically connects to the control chip 313, so as to establish wireless communication between the control chip 313 and the photographic device 200. In this case, the photographic device 200 has another wireless connector that can wirelessly communicate with the wireless connector 314.

Figure 5:
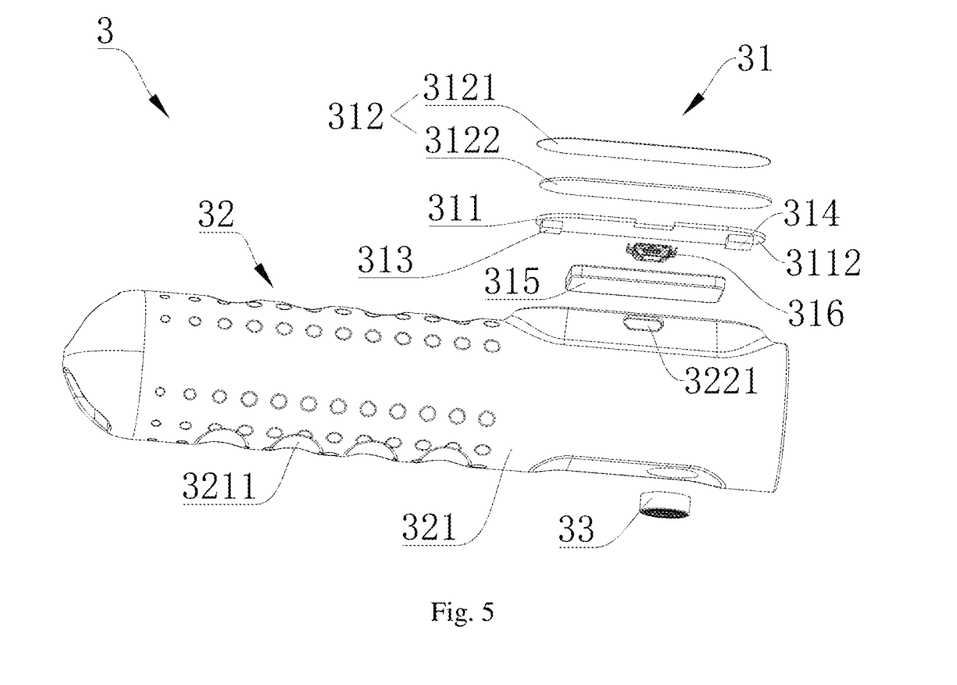
FIG. 5 is an exploded view of the handle assembly as illustrated in FIG. 4.
Figure 6:
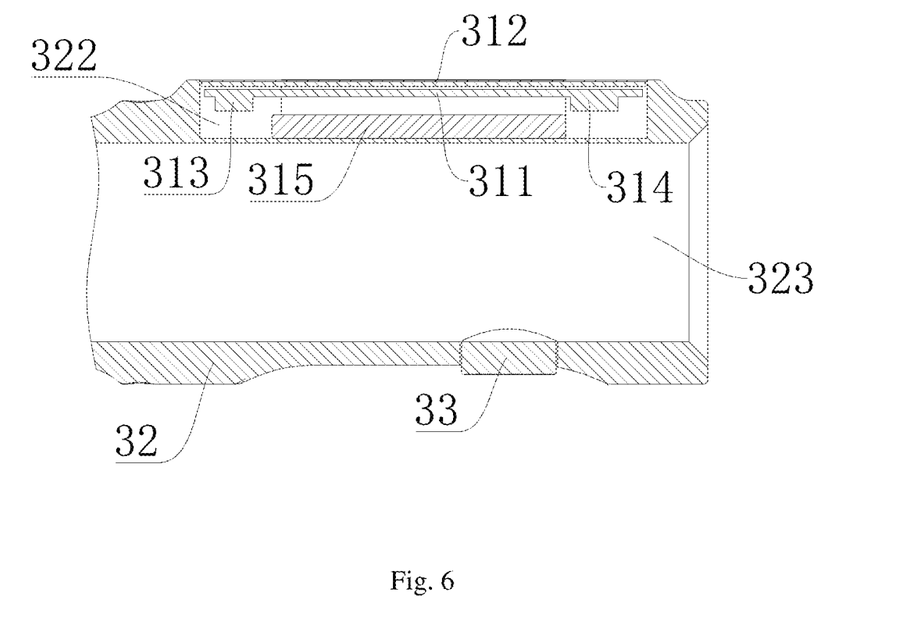
FIG. 6 is a partially structural section view of the handle assembly as illustrated in FIG. 4.

The control board 311 includes a substrate and a circuit formed on the substrate. Preferably, the substrate is made from flexible material.

Preferably, the touch screen 312 includes a flexible touch panel 3121 and a supporting plate 3122 which are laminated. The supporting plate 3122 is sandwiched between the flexible touch panel 3121 and the first surface of the control board 311, and is configured for supporting the flexible touch panel 3121. The supporting plate 3122 may be made of flexible material. Thus, the touch screen 312 is a flexible screen, may be bent according to a shape of a handle body 32, and may also be disposed in any position on the handle body 32 according to requirements, thereby improving the experience of the user using the selfie stick 100.

Preferably, the wireless connector 314 may adopt Bluetooth connection, Wi-Fi connection, ZigBee connection, or NFC (Near Field Communication) connection.

Preferably, the touch screen assembly 31 further includes a battery 315. The battery 315 is arranged below the second surface 3112 of the control board 311 distant from the touch screen 312. The battery 315 electrically connects to the control chip 313, and serves as a power source.

The battery 315 may be a rechargeable battery.

Preferably, the touch screen assembly 31 further includes a charging interface 316. The charging interface 316 is mounted on the control board 311, and electrically connects to the battery 315. The user may charge the battery 315 through the charging interface 316.

The charging interface 316 may be a micro USB interface.

Figure 1:
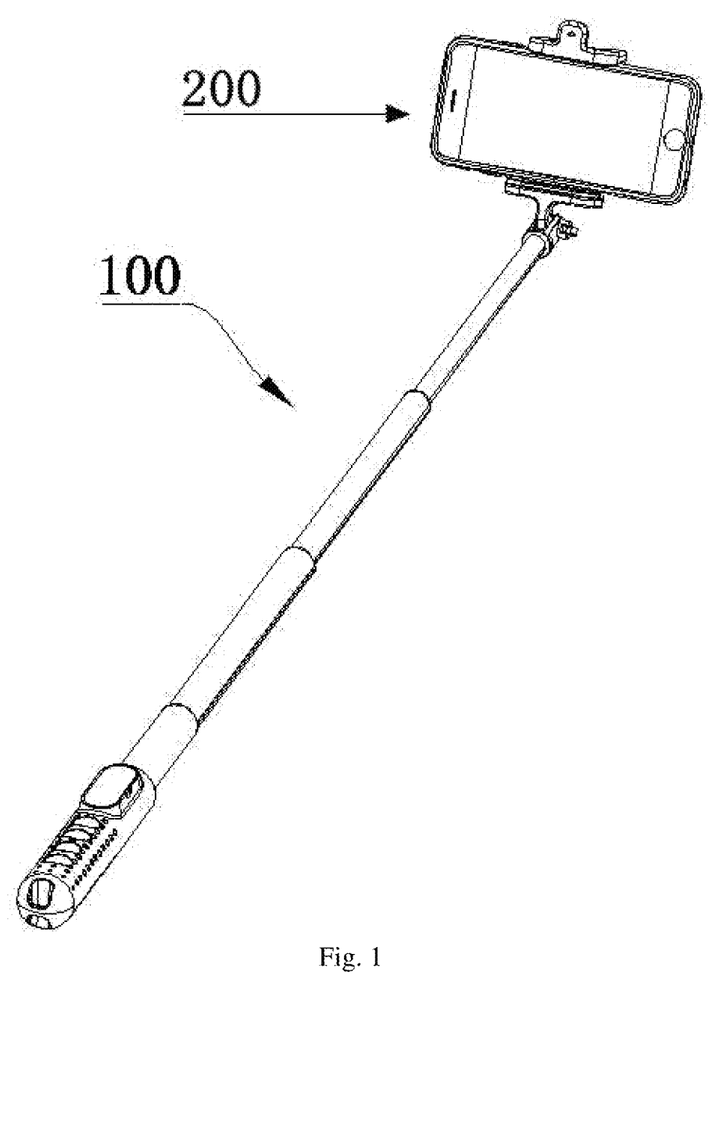
FIG. 1 is a schematic view of a use condition of a selfie stick according to an embodiment of the present disclosure.
Figure 2:
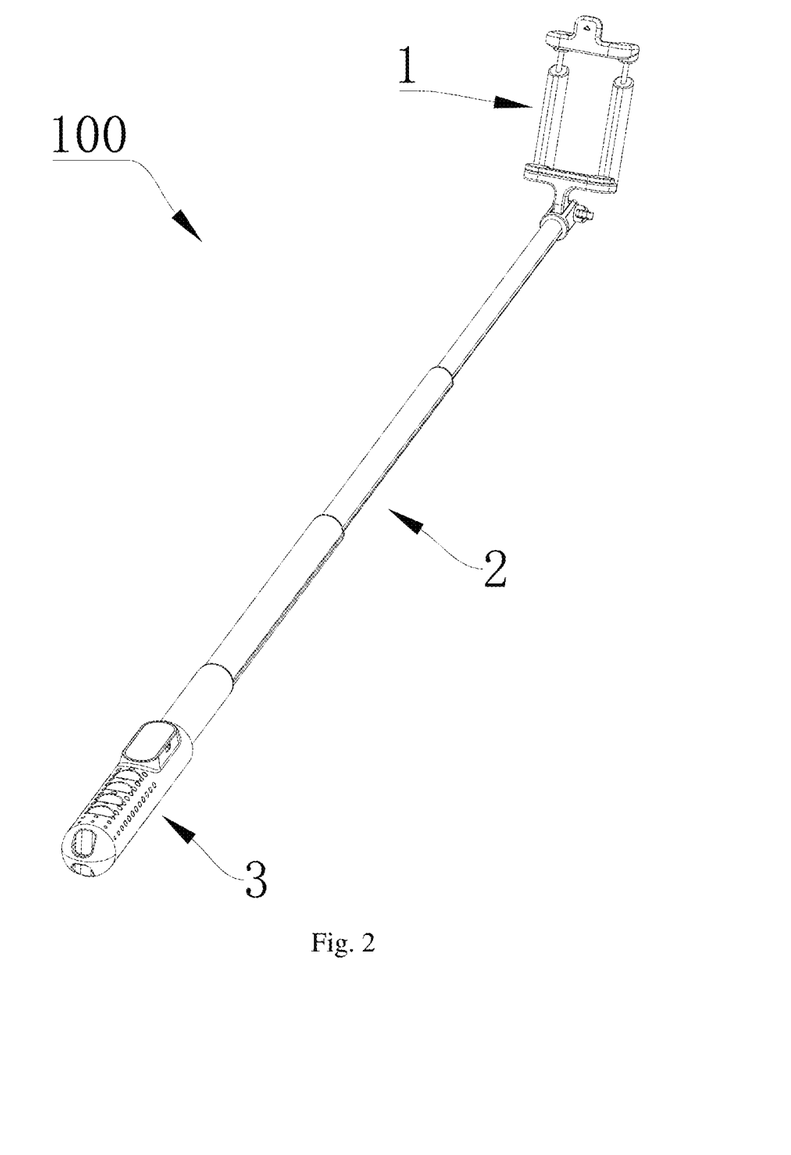
FIG. 2 is a schematic structural view of a selfie stick according to an embodiment of the present disclosure.
Figure 3:
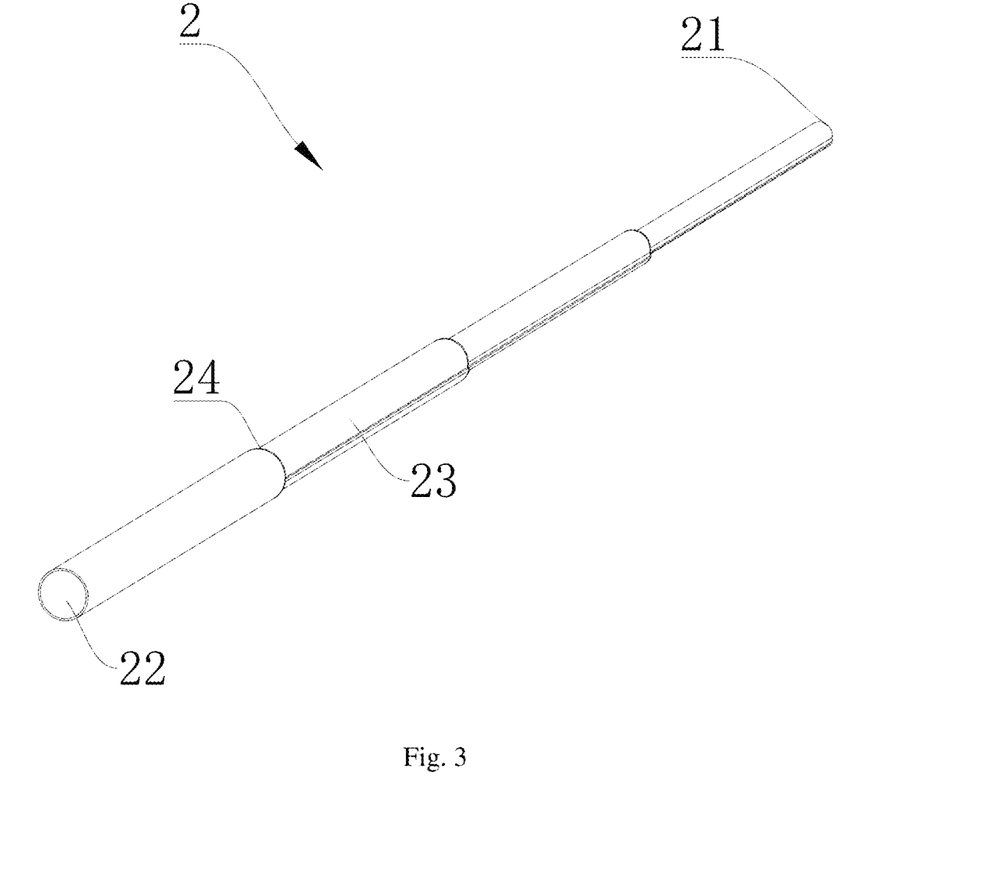
FIG. 3 is a schematic structural view of a telescopic tube assembly of a selfie stick according to an embodiment of the present disclosure.
Figure 4:
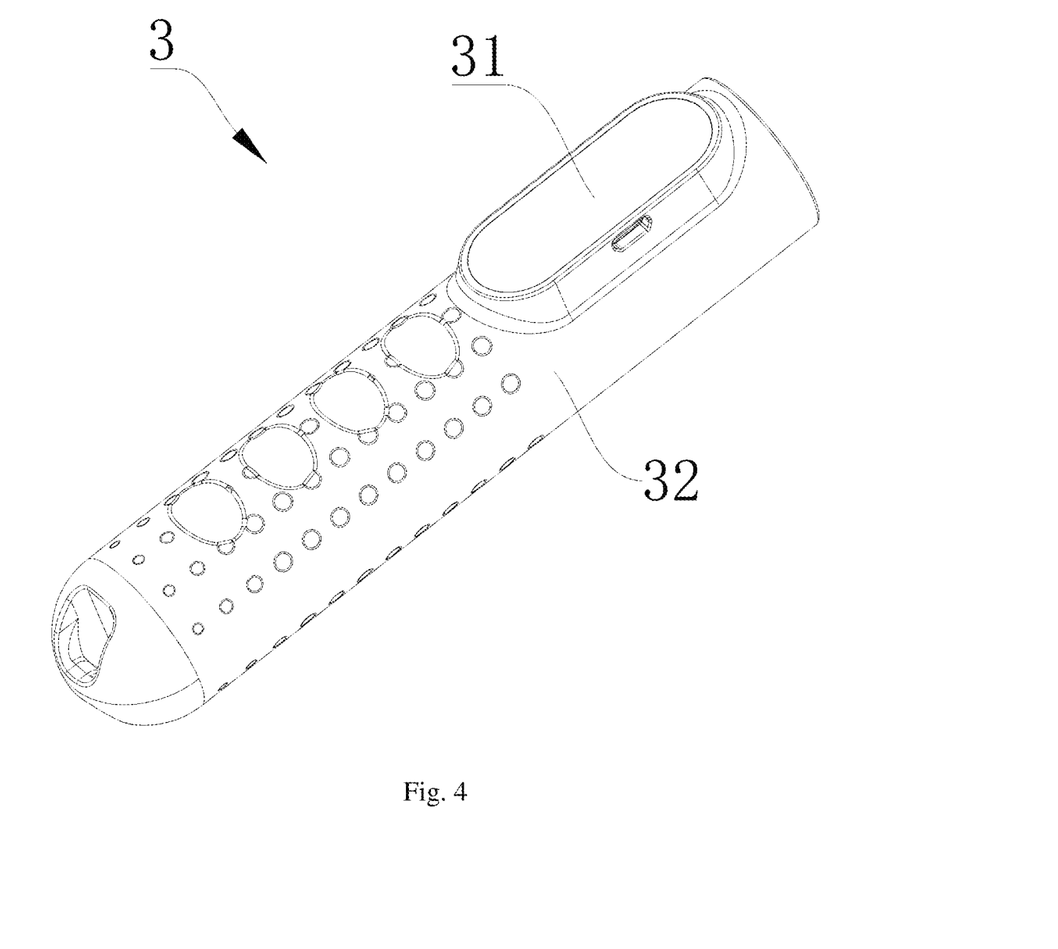
FIG. 4 is a schematic structural view of a handle assembly of a selfie stick according to an embodiment of the present disclosure.

Furthermore, referring to FIG. 4 to FIG. 6, as an optional embodiment, the handle assembly 3 further includes the handle body 32. The handle body 32 includes an outer surface 321. A groove 322 is defined in the outer surface 321 of the handle body. The touch screen assembly 31 is received in the groove 322.

In the embodiment, the touch screen assembly 31 is disposed on the outer surface 321 of the handle body 32 by being received in the groove 322, thereby facilitating the user performing various touch operations with a single hand or two hands when taking photos.

Preferably, a notch 3221 is defined in a side wall of the groove 322. The notch 3221 faces the charging interface 316. The notch 3221 is configured for connecting the charging interface 316 to the outside of the groove 322.

Preferably, the handle assembly 3 further includes a switch button 33. The switch button 33 is mounted on the outer surface 321 of the handle body 32, and electrically connects to the touch screen assembly 31. The user may switch on the touch screen assembly 31 or switch off the touch screen assembly 31 by pressing the switch button 33.

The switch button 33 and the touch screen assembly 31 are located on two opposite sides of the handle body 32, respectively.

Preferably, anti-skid ridges 3211 are formed on the outer surface 321 of the handle body 32. The anti-skid ridges 3211 are configured for increasing friction between the user's palm and the handle body 32, thereby reducing a risk of dropping the selfie stick 100 due to the user's unstable grasp.

The touch screen assembly 31 is arranged between the anti-skid ridges 3211 and the telescopic tube assembly 2. When the user grasps the handle body 32, the user's palm substantially covers the anti-skid ridges 3211, and the user's fingers may slide on the touch screen 312.

Preferably, an installation hole 323 is defined in the handle body 32. The second end 22 of the telescopic tube assembly 2 inserts into the installation hole 323, thereby achieving connection between the telescopic tube assembly 2 and the handle assembly 3.

Referring to FIG. 1 to FIG. 3, FIG. 7 and FIG. 8, as an optional embodiment, the telescopic tube assembly 2 includes a plurality of sleeves 23 and a plurality of brake collars 24. The plurality of sleeves 23 insert and couple one after another in sequence and each of the plurality of brake collars 24 is inserted between adjacent sleeves 23.

In the embodiment, the plurality of sleeves 23 may move relative to each other, so that the overall length of the telescopic tube assembly 2 may vary to change the distance between the photographic device 200 and the user, thereby enabling the user to perform selfie-taking operations from various different distances. During photographing, the brake collars 24 may prevent relative movement between the adjacent sleeves 23, so as to keep the photographic device 200 stable and improve photographic quality.

Figure 7:
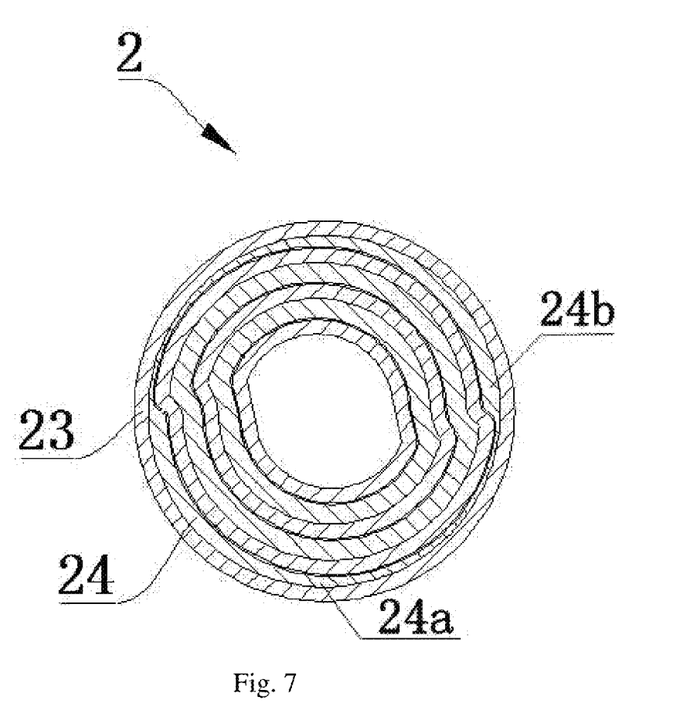
FIG. 7 is a section view of the handle assembly of the selfie stick as illustrated in FIG. 3.
Figure 8:
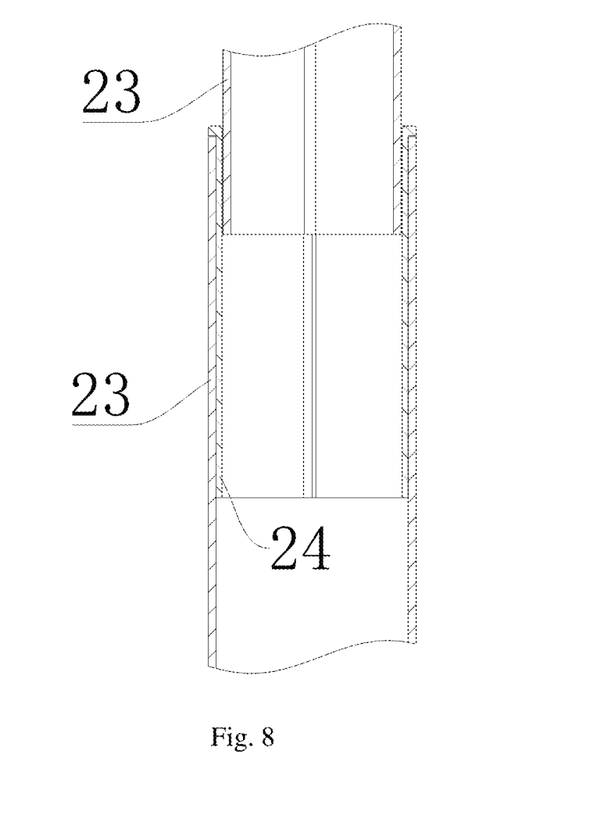
FIG. 8 is a partially structural section view of the selfie stick as illustrated in FIG. 3.

Preferably, the brake collars 24 are non-rotationally symmetrical and are configured for preventing relative rotation between the adjacent sleeves 23. Specifically, each of the brake collars 24 includes two semicircular sections 24a and two connection sections 24b connecting between the two semicircular sections. Two ends of one semicircular section are misaligned with two ends of the other semicircular section, respectively.

Preferably, the plurality of sleeves 23 includes at least one noncircular sleeve. The noncircular sleeve and the collars cooperate with each other. Particularly, a slot is formed in the inner surface of the brake collar 24, while a rib is formed in the outer surface of the sleeve 23 contacting the inner surface of the brake collar 24. The rib is stuck in the slot, thereby preventing the sleeve 23 from rotating circumferentially.

Referring to FIG. 1 to FIG. 3 and FIG. 9, as an optional embodiment, the fixing support assembly 1 includes an upper fixing component 11, a lower fixing component 12, at least one elastically telescopic rail 13, and a fixing support 14. The upper fixing component 11 includes an upper clamping portion 111 and an upper connection portion 112 connecting to the upper clamping portion 111. The lower fixing component 12 includes a lower clamping portion 121, a lower connection portion 122 connecting to the lower clamping portion 121, and an installation portion 123. The lower clamping portion 121 and the upper clamping portion 111 are opposite to each other. The elastically telescopic rail 13 is connected between the upper connection portion 112 and the lower connection portion 122. A distance between the upper fixing component 11 and the lower fixing component 12 can be adjusted by extending or retracting the elastically telescopic rail 13. In other embodiments, the distance between the upper fixing component 11 and the lower fixing component 12 can be adjusted through other telescopic structures. When the elastically telescopic rail 13 is extended, a clamping force is produced between the upper clamping portion 111 and the lower clamping portion 121. The fixing support 14 connects to the first end 21 of the telescopic tube assembly 2. The installation portion 123 couples to the fixing support 14.

Figure 9:
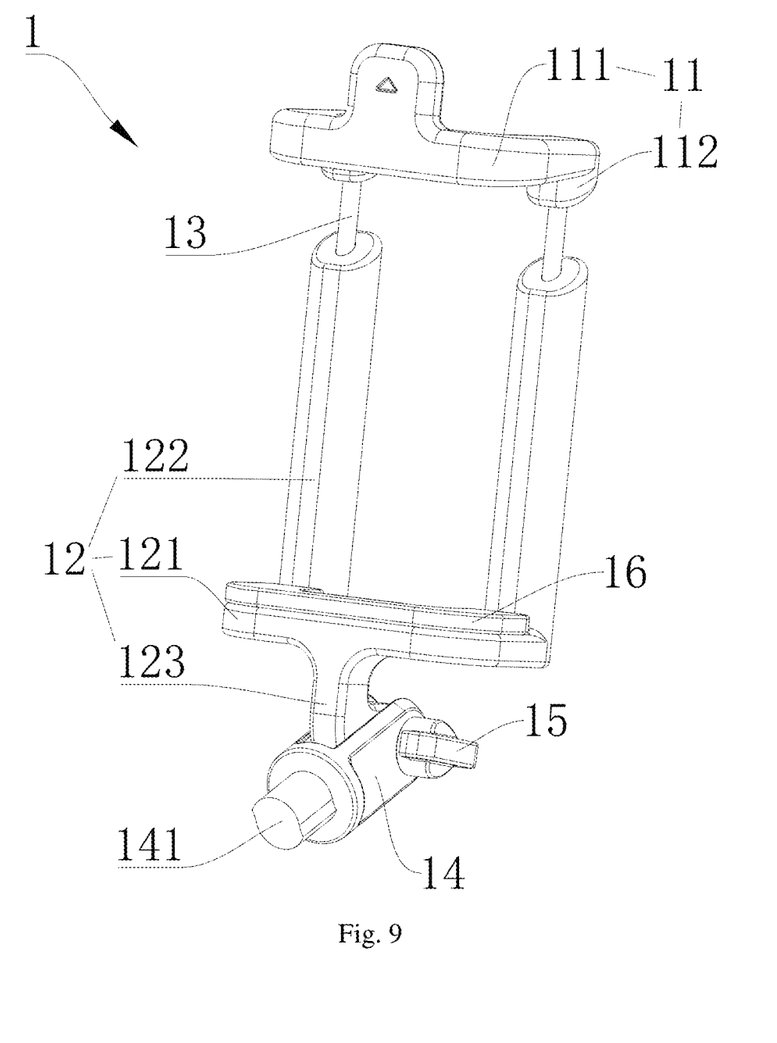
FIG. 9 is a schematic structural view a fixing support assembly of a selfie stick according to an embodiment of the present disclosure.

When the user fits the photographic device 200 to the fixing support assembly 1, the photographic device 200 is located between the upper fixing component 11 and the lower fixing component 12, and the elastically telescopic rail 13 is extended, so that the clamping force is produced between the upper clamping portion 111 and the lower clamping portion 121, thereby clamping the photographic device 200.

Preferably, the fixing support assembly 1 further includes an adjusting knob 15. The installation portion 123 rotatably connects to the fixing support 14 by the adjusting knob 15. When the adjusting knob 15 is loosened, the installation portion 123 can rotate relative to the fixing support 14, thereby being capable of adjusting the photographing angle of the photographic device 200. When the adjusting knob 15 is tightened, the installation portion 123 is fixed relative to the fixing support 14, so that the photographic device 200 can be kept stable during photographing.

Preferably, the fixing support assembly 1 further includes an anti-skid element 16. In the present embodiment, the anti-skid element 16 is an anti-skid pad 16. In other embodiments, the anti-skid element 16 can be anti-skid stripe. The anti-skid pad 16 is arranged on a surface of the lower clamping portion 121 facing the upper clamping portion 111, and is configured for increasing friction between the fixing support assembly 1 and the photographic device 200, thereby reducing a risk of the photographic device 200 being dropped from the fixing support assembly 1. In other embodiments, the anti-skid element 16 is arranged on a surface of the upper clamping portion 111 facing the lower clamping portion 121, or both the surface of the upper clamping portion 111 facing the lower clamping portion 121 and the surface of the lower clamping portion 121 facing the upper clamping portion 111.

The anti-skid pad 16 may be made from silicone material.

Preferably, the fixing support 14 includes a fixing end 141. The fixing end 141 is inserted into a sleeve 23 located at the first end 21 of the telescopic tube assembly 2. The fixing end 141 is a noncircular column. When the fixing end 141 couples to the sleeve 23, the fixing end 141 and the sleeve 23 are stationary relative to each other.

Referring to FIG. 1 to FIG. 10, a method for controlling the photographic device by the selfie stick is further provided by an embodiment of the present disclosure. The selfie stick may be the selfie stick 100 according to any embodiment described above.

Figure 10:
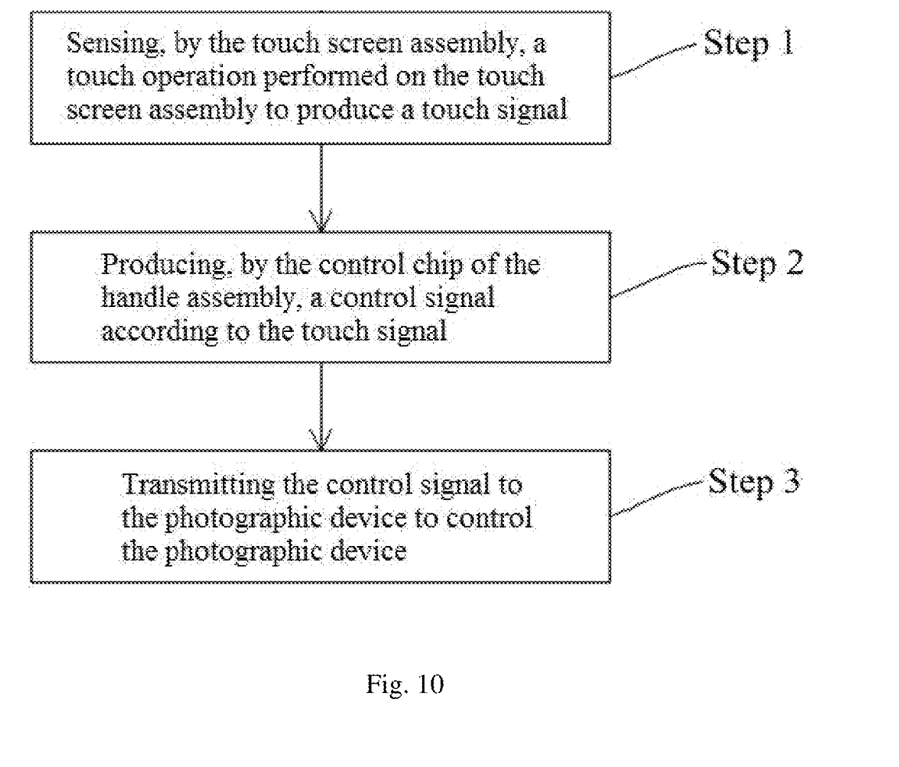
FIG. 10 is a flowchart of a method for controlling a photographic device by a selfie stick according to an embodiment of the present disclosure.

The method for controlling the photographic device 200 by the selfie stick 100, includes:

a step 1 of sensing, by the touch screen assembly 31, a touch operation performed on the touch screen assembly 31 to produce a touch signal;

a step 2 of producing, by the control chip 313 of the handle assembly 3, a control signal according to the touch signal; and a step 3 of transmitting, by the wireless connector 314, the control signal to the photographic device 200 to control the photographic device 200.

In the embodiment, the method for controlling the photographic device 200 by the selfie stick 100 may, by touching the touch screen assembly 31 with different touch operations, adjust various photographic parameters or functions of the photographic device 200, for example, a focal length, an aperture, a color, etc., so that the user can achieve better photographing experience.

Particularly, the touch screen assembly 31 can sense the touch operations performed on the flexible touch panel 3121. The switch button 33 and the touch screen assembly 31 are located on the two opposite sides of the handle assembly 3, so that the user can perform the touch operations on the selfie stick 100 more easily. The wireless connector 314 of the touch screen assembly 31 can transmit the control signal to the photographic device 200.

The embodiments of the present disclosure are described in detail hereinbefore. The principles and embodiments of the present disclosure are set forth by way of specific examples herein. The description of the above-mentioned embodiments is merely for assisting in understanding the methods and spirits of the present disclosure. Meanwhile, based on the spirits of the present disclosure, persons skilled in the art can make modifications to the embodiments and application scope. In conclusion, the content of the present disclosure should not be considered as a limitation on the present disclosure.

What is claimed is:

1. A selfie stick, comprising:
   a telescopic tube assembly;
   a fixing support assembly, configured for clamping a photographic device and connecting to a first end of the telescopic tube assembly; and
   a handle assembly, connecting to a second end of the telescopic tube assembly, the second end of the telescopic tube assembly being distant from the first end, wherein the handle assembly comprises a touch screen assembly wirelessly connecting to the photographic device, and the photographic device is controlled by touching the touch screen assembly, wherein the touch screen assembly comprises:
- a control board having a first surface and a second surface opposite to each other;
- a touch screen arranged on the first surface;
- a control chip electrically connecting to the touch screen;
- a wireless connector electrically connecting to the control chip so as to establish wireless communication between the control chip and the photographic device;
- a battery arranged below the second surface of the control board distant from the touch screen and providing power for the control chip; and
- a charging interface mounting on the control board and electrically connecting to the battery; and the handle assembly further comprises a handle body, the handle body comprises an outer surface, a groove is defined in the outer surface of the handle body, the touch screen assembly is received in the groove, a notch is defined in a side wall of the groove, and the notch faces the charging interface.

2. The selfie stick of claim 1, wherein, the handle assembly further comprises a handle body, the handle body comprises an outer surface, a groove is defined in the outer surface of the handle body, and the touch screen assembly is received in the groove.

3. The selfie stick of claim 1, wherein, the touch screen comprises a flexible touch panel and a supporting plate which are laminated, and the supporting plate is sandwiched between the flexible touch panel and the first surface of the control board, and the supporting plate supports the flexible touch panel.

4. The selfie stick of claim 1, wherein, the wireless connector adopts Bluetooth connection, Wi-Fi connection, ZigBee connection, or NFC connection.

5. The selfie stick of claim 2, wherein, the handle assembly further comprises a switch button mounting on the outer surface of the handle body, and the switch button electrically connects to the touch screen assembly.

6. The selfie stick of claim 5, wherein, the switch button and the touch screen assembly are located on two opposite sides of the handle body, respectively.

7. The selfie stick of claim 2, wherein, anti-skid ridges are formed on the outer surface of the handle body, and the touch screen assembly is arranged between the anti-skid ridges and the telescopic tube assembly.

8. The selfie stick of claim 2, wherein, an installation hole is defined in the handle body, and the second end of the telescopic tube assembly inserts into the installation hole.

9. The selfie stick of claim 1, wherein, the telescopic tube assembly comprises a plurality of sleeves and a plurality of brake collars, the plurality of sleeves insert and couple one after another in sequence, and each of the plurality of brake collars is inserted between adjacent sleeves.

10. The selfie stick of claim 9, wherein, the brake collars are non-rotationally symmetrical and are configured for preventing relative rotation between the adjacent sleeves.

11. The selfie stick of claim 1, wherein, the fixing support assembly comprises:
- an upper fixing component, comprising an upper clamping portion and an upper connection portion connecting to the upper clamping portion;
- a lower fixing component, comprising a lower clamping portion, a lower connection portion connecting to the lower clamping portion, and an installation portion, wherein the lower clamping portion and the upper clamping portion are opposite to each other;
- at least one elastically telescopic rail, connected between the upper connection portion and the lower connection portion, wherein when the elastically telescopic rail is extended, a clamping force is produced between the upper clamping portion and the lower clamping portion; and
- a fixing support, connecting to the first end of the telescopic tube assembly, wherein the installation portion couples the fixing support.

12. The selfie stick of claim 11, wherein, the fixing support assembly further comprises an adjusting knob, and the installation portion rotatably connects to the fixing support by the adjusting knob.

13. The selfie stick of claim 11, wherein, the fixing support assembly further comprises an anti-skid element arranged on a surface of the lower clamping portion facing the upper clamping portion.

14. A method for controlling a photographic device by a selfie stick, comprising:
- sensing, by a touch screen assembly of a handle assembly of the selfie stick, a touch operation performed on the touch screen assembly to produce a touch signal;
- producing, by a control chip of the handle assembly, a control signal according to the touch signal; and
- transmitting, by a wireless connector, the control signal to the photographic device to control the photographic device, wherein the touch screen assembly comprises:
- a control board having a first surface and a second surface opposite to each other;
- a touch screen arranged on the first surface;
- a control chip electrically connecting to the touch screen;
- a wireless connector electrically connecting to the control chip so as to establish wireless communication between the control chip and the photographic device;
- a battery arranged below the second surface of the control board distant from the touch screen and providing power for the control chip; and
- a charging interface mounting on the control board and electrically connecting to the battery; and the handle assembly further comprises a handle body, the handle body comprises an outer surface, a groove is defined in the outer surface of the handle body, the touch screen assembly is received in the groove, a notch is defined in a side wall of the groove, and the notch faces the charging interface.

15. The method of claim 14, wherein, the touch screen assembly comprises a flexible touch panel and a control board, and the flexible touch panel and the control chip are located on two opposite sides of the control board, respectively.

16. The method of claim 14, wherein, the handle assembly further comprises a switch button, and the switch button and the touch screen assembly are located on two opposite sides of the handle assembly, respectively.

* * * * *